United States Patent

Nishiwaki et al.

[11] Patent Number: 5,745,221
[45] Date of Patent: Apr. 28, 1998

[54] EXPOSURE EQUIPMENT

[75] Inventors: Seiji Nishiwaki, Osaka; Junichi Asada, Ibaraki; Keiichi Matsuzaki, Ikeda, all of Japan

[73] Assignee: Matsushita Electric Industrial, Co., Ltd., Osaka, Japan

[21] Appl. No.: 816,831

[22] Filed: Mar. 18, 1997

[30] Foreign Application Priority Data

Mar. 18, 1996 [JP] Japan .................. 8-060525
Oct. 2, 1996 [JP] Japan .................. 8-261488

[51] Int. Cl.$^6$ ............... G03B 27/42; G03B 27/52
[52] U.S. Cl. ............... 355/71; 355/53; 359/569; 430/5
[58] Field of Search .................. 355/18, 53, 71, 355/67; 359/558, 559, 562, 564, 566, 569; 430/5

[56] References Cited

U.S. PATENT DOCUMENTS

| | | | |
|---|---|---|---|
| 5,446,587 | 8/1995 | Kang et al. | 359/562 |
| 5,587,834 | 12/1996 | Noguchi | 359/558 |
| 5,608,575 | 3/1997 | Suzuki | 359/558 |
| 5,638,211 | 6/1997 | Shiraishi | 359/559 |
| 5,642,183 | 6/1997 | Sugihara et al. | 355/71 |

*Primary Examiner*—A. A. Mathews
*Attorney, Agent, or Firm*—Beveridge, DeGrandi, Weilacher & Young, LLP

[57] ABSTRACT

An exposure equipment which is simply configured and can expose fine cyclic patterns whose pitch is smaller than the wavelength of light source has the laser beam 2 (wavelength $\lambda$) outgoing from the light source 1 reflected on the mirror 3a, 3b, guided to the beam expander optical system 4, and converged by a focusing lens 4a, passing through a pinhole 4c located on the focal plane of the focusing lens 4a, and converted into parallel beam 5 with the beam diameter expanded by a collimator lens 4b, wherein this parallel beam 5 vertically impinges on and penetrates a phase shifter 6 with recessed portion and protruded portion repeatedly formed on the outgoing surface side of the parallel flat plate configured with transparent material of refraction index n, and as a result, ± first order diffracted light is generated, and the ± first order diffracted lights interfere with one another on the sensitized film facing the phase shifter via a spacer 7 to form fine fringes, thereby exposing the sensitized film.

21 Claims, 13 Drawing Sheets

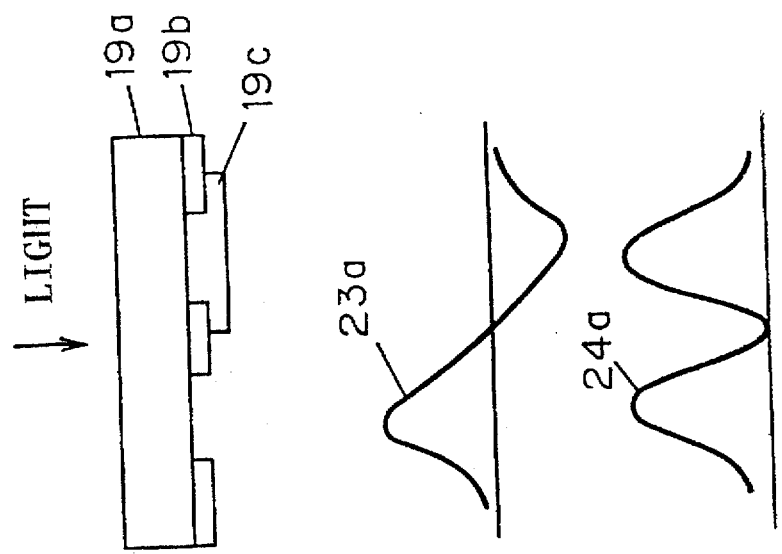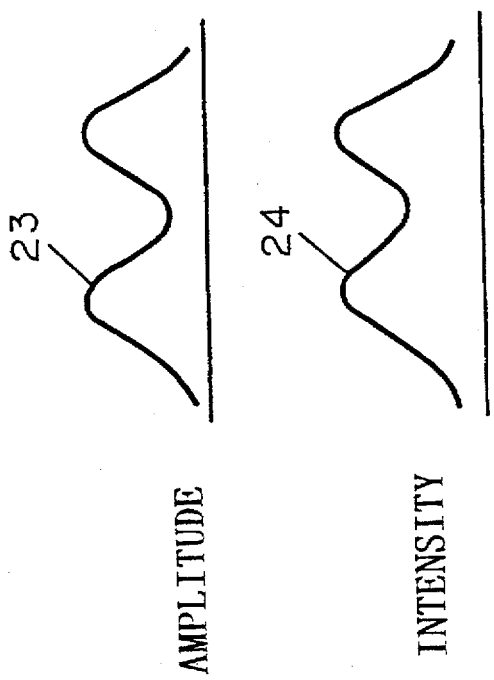
PRIOR ART
Fig. 2 (A)
PRIOR ART
Fig. 2 (B)

EXPOSURE EQUIPMENT

BACKGROUND OF THE INVENTION

1. Field of the Invention

The present invention relates to an equipment for exposing fine cycling patterns.

2. Related Art of the Invention

With respect to conventional techniques, for example, there is a projection exposure equipment in P. 690 of Micro Optics Handbook (edited by the Applied Physics Society, Asakura Shoten Publishing Company, 1995), and referring to this equipment, the technique is described. FIG. 1 shows a configuration of a conventional exposure equipment. The beam from a light source 14 is converted to a proper beam by a beam compressor 15 (or beam expander) and impinges on a homogenizer 16. The homogenizer 16 comprises 3 to 6 mm square lens arrays, and homogenizes illuminance distribution of the lighting system as well as forms the secondary light source 17 in the vicinity of exit end face. The light from the secondary light source 17 illuminates a reticle 19 with an exposure pattern drawn by a lighting lens 18 and forms image on the exposure surface 22 with an image forming lens 20. In this event, the image of the secondary light source 17 is formed on the entrance pupil surface 21.

The resolution R of this conventional exposure equipment can be expressed by the following equation with the wavelength of illuminating light designated by $\lambda$ and the number of apertures of the image-formation optical system by NA (Numerical Aperture):

$$R = 2k_1 \lambda / NA \quad (1)$$

where, $k_1$ is a constant determined from exposure/development process conditions, and, in general, takes the value about 0.5 to 0.8.

In the meantime, the depth of a focus Z of the image-formation optical system is given by the following equation:

$$Z = \lambda / 2NA^2 \quad (2)$$

Wavelength $\lambda$ is unequivocally determined by the type of light source, and in general, 435 nm (g ray) or 365 nm (i ray) is used. It is the simplest method for improving the resolution to further shorten wavelengths of the light source, or it is possible to improve the resolution by adopting NA with a high value. However, because higher NA shallows the depth of a focus based on Eq. (2) and eliminates an error allowance of the exposure position, it is restricted to more or less 0.5 to 0.6. Consequently, the resolution R of the conventional exposure equipment is restricted to about $1.6\lambda$ in terms of pitch with $k_1 = 0.5$, NA=0.6. A technique called a phase shift method is proposed to improve this resolution limit (P. 694 of the Micro-optics Handbook). In this proposal, a phase shifter is formed on the reticle for improving the resolution in the conventional exposure equipment. FIG. 2(A) and FIG. 2(B) show a principle of the phase shift method in the conventional exposure equipment. The reticle 19 in the conventional method is formed with a transparent base plate 19a and a mask 19b, where the light amplitude on the exposure surface is denoted with numeral 23 and light intensity with 24. As against this, in the phase shift method, a phase shifter 19c is formed in every other clearance between masks, and by delaying the phase of light passing the phase shifter 19c by $\pi$, we can have the light amplitude and light intensity shown with 23a, 24a on the exposure surface, and the contrast is able to be improved as compared to the conventional method. There is also a method which does not use a mask 19b, whose working principle is shown in FIG. 3. In this event, the reticle 19 comprises a transparent substrate 19a and phase shifter 19c. The phase shifter 19c is able to achieve light amplitude and light intensity shown in 23b and 24b on the exposure surface by delaying by $\pi$ the light phase passing the phase shifter 19c, enabling improvement of the contrast.

In the conventional exposure equipment as described above, following problems are found irrespective of the presence of the phase shifter 19c or not.

Now referring to an exposure equipment with higher resolution to which a phase shifter 19c is mounted, such problems will be described in detail.

That is, in this case, according to the principle shown in FIG. 3, the cycle of light intensity 24b on the exposure surface is one half that of the phase shifter 19c on the reticle, and by the adoption of the phase shift method, the resolution of the exposure equipment should be doubled. However, in actuality, because the image-forming optical system intervenes between the reticle 19 and the exposure surface, the resolution according to the theory is unable to be obtained.

The reasons are shown as follows. That is, FIG. 4 shows the optical path of the light penetrating the reticle with a phase shifter. Light 25 (wavelength $\lambda$) impinging on the reticle 19 separates into the beam that penetrates as it is by penetrating the phase shifter 19c (zero-order beam) and diffracted beam ($\pm$ first order beam). Let the cycle of the phase shifter 19c be $\Lambda$, the diffraction angle $\theta$ of diffracted beam is given by the following equation:

$$\sin \theta = \lambda / \Lambda \quad (3)$$

These penetration and diffraction beams impinge on the image forming lens 20, and form images on the pupil surface 21 as shown in 26, 26A, and 26B, respectively. The image-forming point of the zero-order beam is located on the optical axis 27, but since the $\pm$ first-order beam is tilted by $\theta$ in the traveling direction with respect to the optical axis 27, the image is formed at the position "b" away from the optical axis. Because the size of "b" is proportional to $\sin \theta$, if the cycle $\Lambda$ becomes smaller than a certain value, the image forming point of the $\pm$ first-order beam is located outside the aperture of the pupil surface (b>a) and the light is shielded in the area outside the aperture of the pupil. Because the projected pattern on the exposure surface is formed by the light penetrating the pupil surface 21, shielding part of the penetrating light results in degradation of resolution of the projected pattern.

Based on the foregoing, the effects of the phase shift method is restricted to at most 30 to 40% improvement in resolution. That is, if the resolution of the exposure equipment is expressed by substituting the pitch of the projected pattern formed on the exposure surface 22, it is said that it would be limited to formation of about 1.2 $\lambda$ pitch.

Degradation of the resolution described above is essentially generated irrespective of presence of the phase shifter 19c, and if the phase shifter 19c is not used, the resolution further degrades.

SUMMARY OF THE INVENTION

Under these conditions, the present invention is to provide an exposure equipment of high resolution which has simple construction and can expose fine patterns whose exposure pattern pitch is $\lambda$ (wavelength of light source) or smaller, and is designed to have the following configuration in order to solve the above-mentioned problems.

The present invention is an exposure equipment which comprises a laser beam source, an expanding means for expanding laser beams of wavelength λ outgoing from the laser beam source and forming it into plane wave of parallel beams, a plate-form member formed with transparent material with refraction index n, and an exposure substrate located close to the plate-form member on the surface of which sensitized film is formed, wherein on the surface of the plate-form member facing against the exposure substrate side, recessed portion and protruded portion are repeatedly formed, and allowing the plane wave expanded by the expanding means to penetrate the recessed portion or protruded portion generates a ± first order diffracted light, and the sensitized film is located at the position in which the + first order diffracted light and the − first order diffracted light intersect each other, fringes generated by interference between the diffracted lights exposes the sensitized film.

According to the above-mentioned configuration, in the present invention, fringes with a pitch one half that of the said recessed or protruded portion are formed with good contrast on the sensitized film, and an exposure equipment with high resolution can be realized.

The present invention is an exposure equipment which comprises the recessed portion or protruded portion covered with a transparent layer of refraction index $n_0$ (where, $n_0 > n$) and the film thickness of the transparent layer which is greater than a pitch of the recessed portion or protruded portion.

With this configuration, it is possible to suppress generation of diffracted light of ± second-order or higher.

The present invention is an exposure equipment which comprises a laser beam source, an expanding means for expanding laser beams of wavelength λ outgoing from the laser beam source and forming it into plane wave of parallel beams, a plate-form member formed with transparent material with refraction index n, and an exposure substrate located close to the plate-form member on the surface of which sensitized film is formed, wherein on the surface of the plate-form member facing against the exposure substrate side, recessed portion and protruded portion are repeatedly formed, and allowing the plane wave expanded by the expanding means to penetrate the recessed portion or protruded portion generates a zero order and ± first order to ±q order ($q \geq 1$) diffracted lights, and ratio of sum of light quantity of even order diffracted lights of these lights to sum of light quantity of odd order diffracted lights of these lights ranges from 0.5 to 2.0, the sensitized film is located at the position in which these diffracted lights intersect one another, fringes generated by interference between the diffracted lights exposes the sensitized film.

BRIEF DESCRIPTION OF THE DRAWINGS

FIG. 2(A) and FIG. 2(B) are diagrams showing the working principle of the phase shift method in the conventional exposure equipment;

Description of the Reference Numerals

1 . . . laser beam source, 2 . . . laser beam 3a, 3b . . . reflection mirror, 4 . . . beam expander optical system 4a . . . focusing lens, 4b . . . collimator lens, 4c . . . pinhole 5 . . . parallel beam, 6 . . . phase shifter, 6a . . . cyclic rugged structure, 7 . . . spacer, 8 . . . sensitized film 9 . . . exposure substrate

DESCRIPTION OF THE PREFERRED EMBODIMENTS

Figure 1:
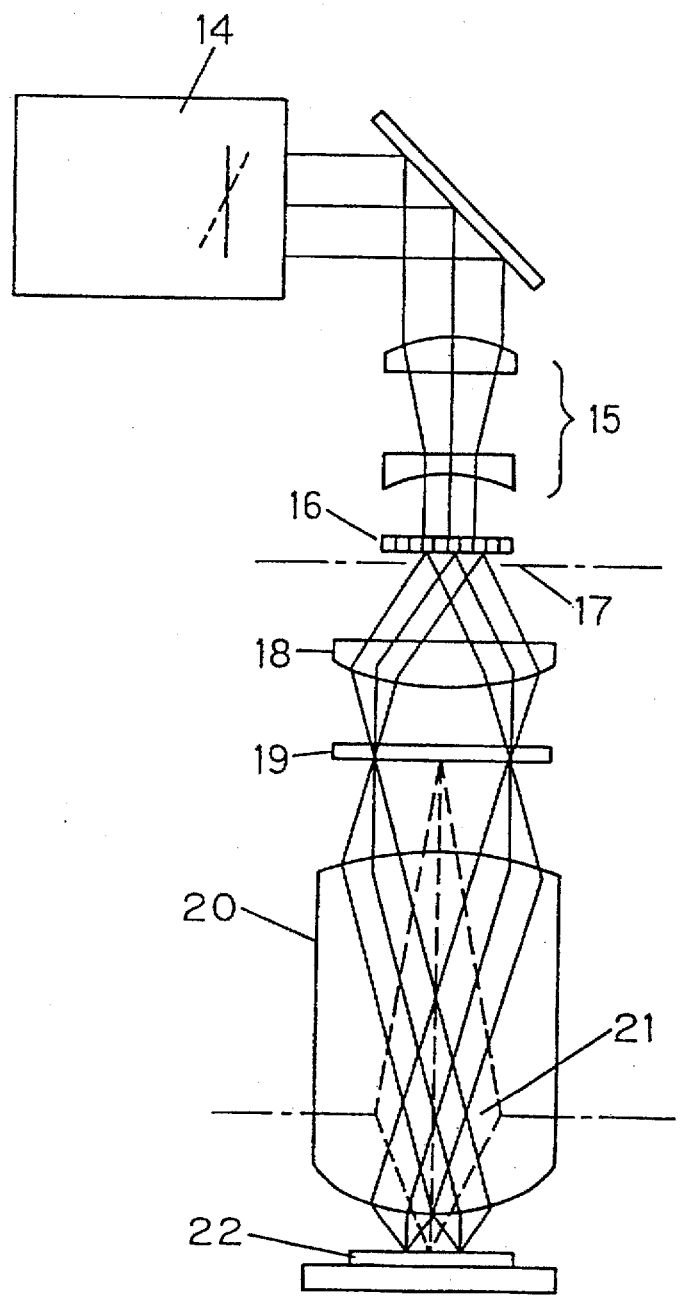
FIG. 1 is a schematic representation of a conventional exposure equipment.
Figure 3:
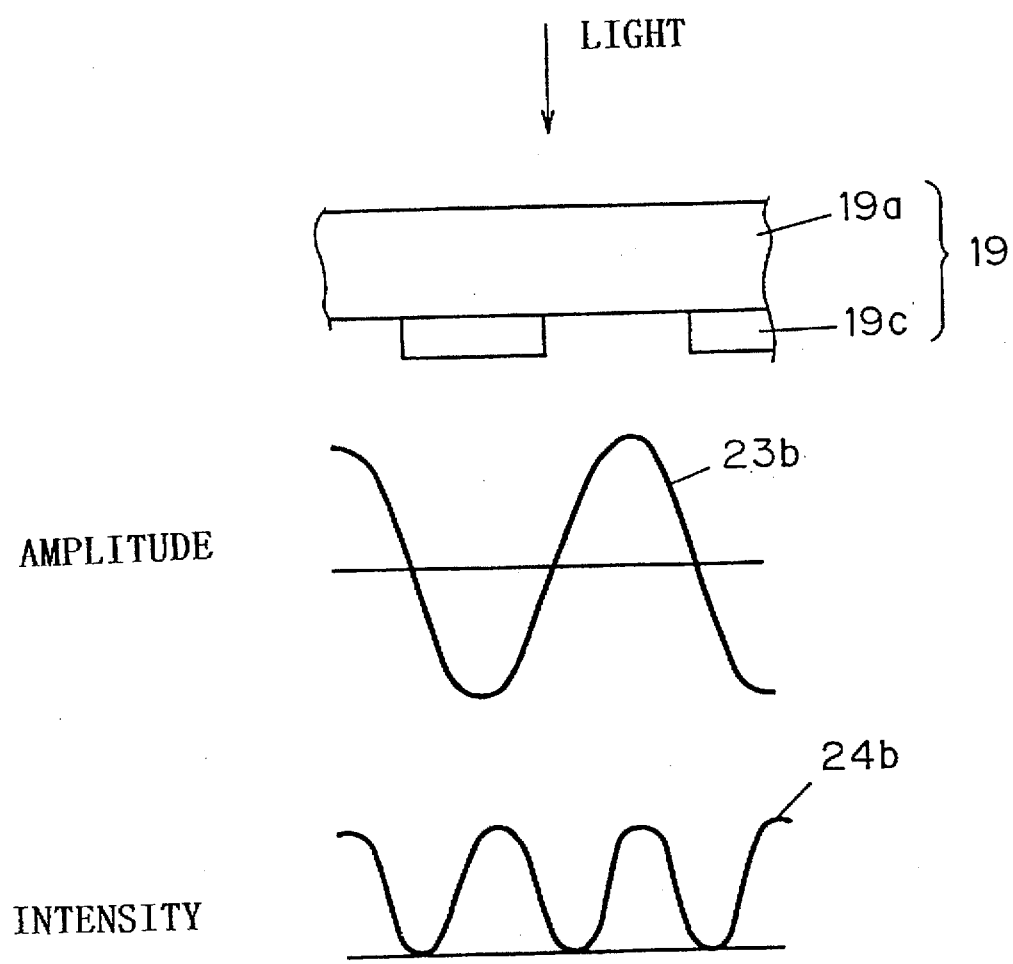
FIG. 3 is a diagram showing the working principle of the other phase shift method in the conventional exposure equipment.
Figure 4:
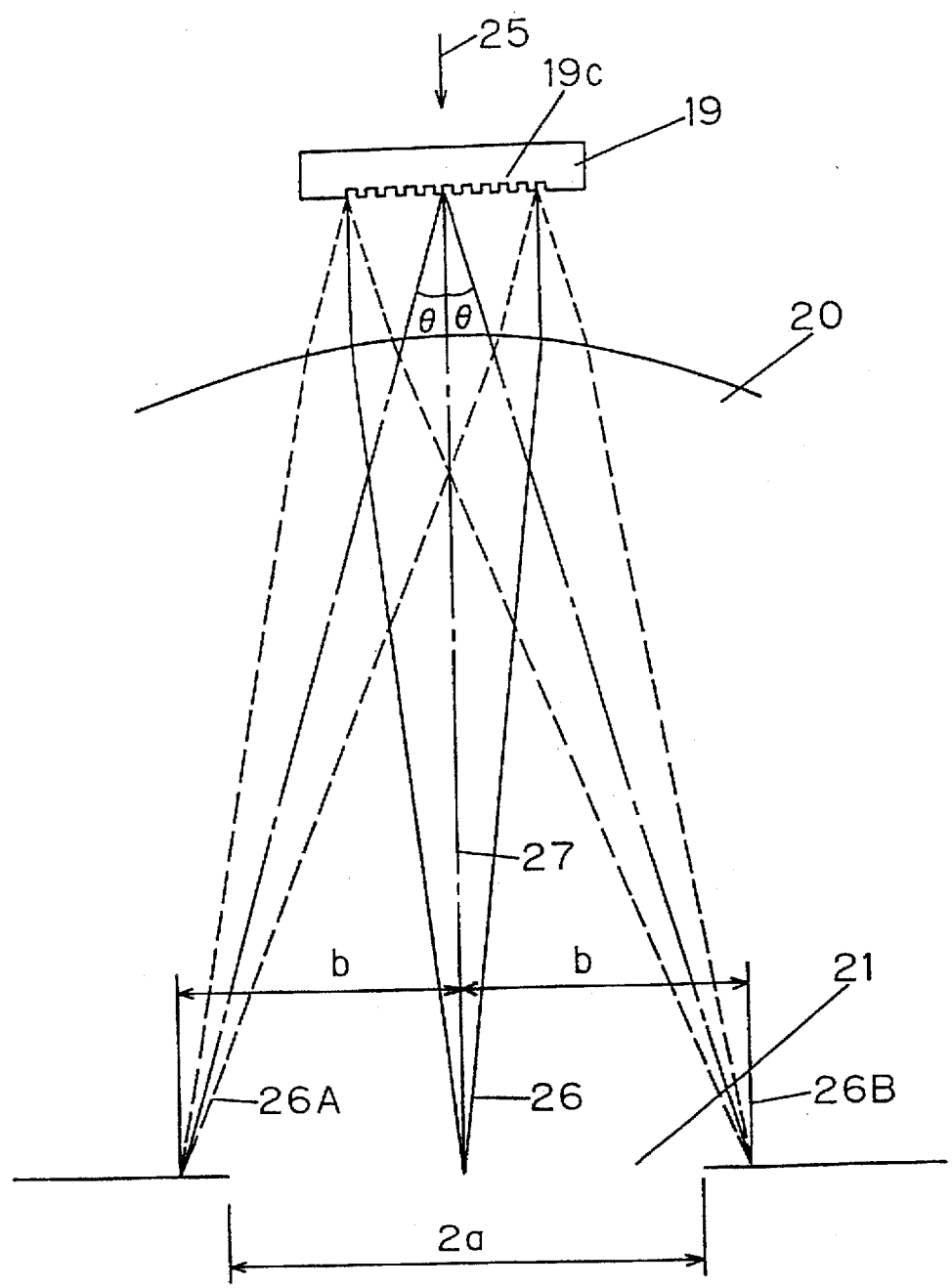
FIG. 4 is a diagram showing an optical path of the light penetrating a reticle with a phase shifter in the conventional exposure equipment.
Figure 5:
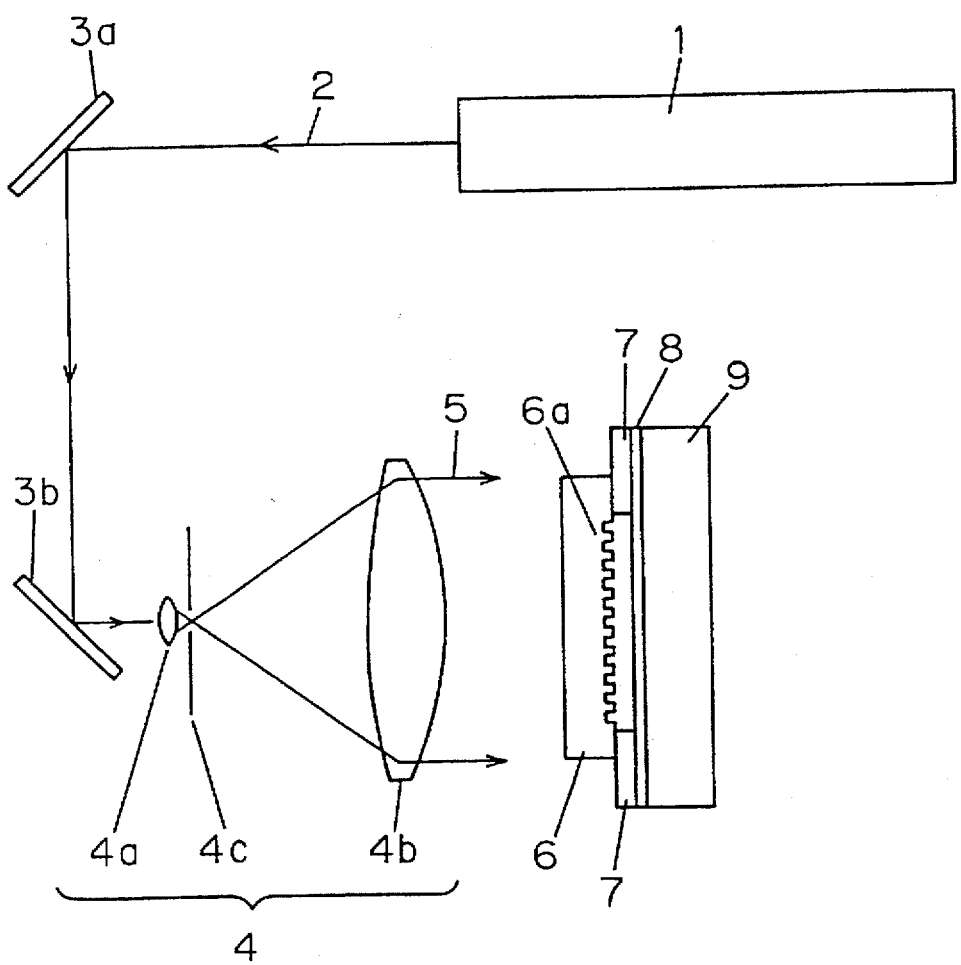
FIG. 5 is a schematic representation of an exposure equipment according to the first embodiment of the present invention.

Referring now to FIG. 5 to FIG. 11, there is shown the first embodiment of this invention. FIG. 5 shows a construction of the exposure equipment according to the embodiment of this invention, which comprises a laser beam source 1, reflecting mirror 3a, 3b, beam expander optical system 4, phase shifter 6, spacer 7, and exposure substrate 9. In FIG. 5, laser beam 2 (wave length λ) impinging from a light source 1, such as Ar laser, He-Cd laser, etc. reflects a mirror 3a, 3b, and is guided to the beam expander optical system 4.

The beam expander optical system 4 comprises a focusing lens 4a, collimator lens 4b, and pinhole 4c, wherein laser beam is converged by a focusing lens 4a, passes through the pinhole 4c located on the focal plane of the focusing lens 4a, and is converted to parallel beam 5 with the beam diameter expanded by the collimator lens 4b. In this event, the pinhole 4c works to remove speckle noise of laser. The parallel beam 5 of plane wave vertically impinges on and penetrates the parallel flat plate shape phase shifter 6 formed with transparent material with the refraction index n.

The outgoing surface side of the phase shifter 6 has the cyclic rugged structure 6a in depth $\lambda/\{2(n-1)\}$ (the cyclic rugged structure means a construction in which the recessed and protruded portions are repeatedly formed on a flat plate at a specified pitch), and the plane wave is converted to the wave surface which repeats the $\pi$ phase difference periodically by penetrating this cyclic construction, and as a result, ± first-order diffraction light is generated.

On the surface of the exposure substrate 9, sensitized film 8 is laminated, and on this sensitized film, the ± first-order diffraction light interferes with each other to form fringes at fine pitches and expose the sensitized film. The sensitized film 8 opposes to the phase shifter 6 via the spacer 7, and a clearance equivalent to the thickness of the spacer 7 exists between the cyclic construction face 6a and sensitized film 8.

Figure 6:
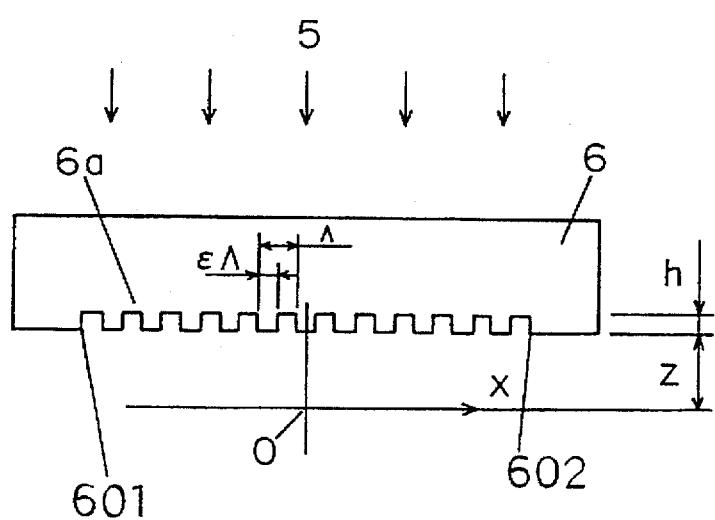
FIG. 6 is a section view of a phase shifter of the exposure equipment according to the first embodiment of the present invention.
Figure 7:
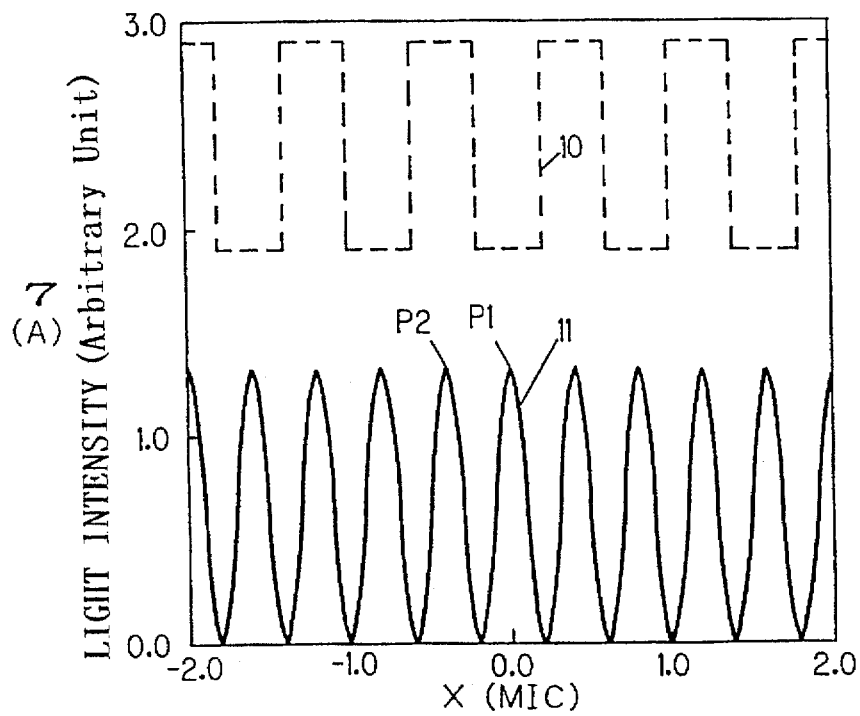
FIG. 7(A) and FIG. 7(B) are first illustrative diagrams showing the characteristics of light intensity distribution on the sensitized film of the exposure equipment according to the first embodiment of the present invention.
Figure 7:
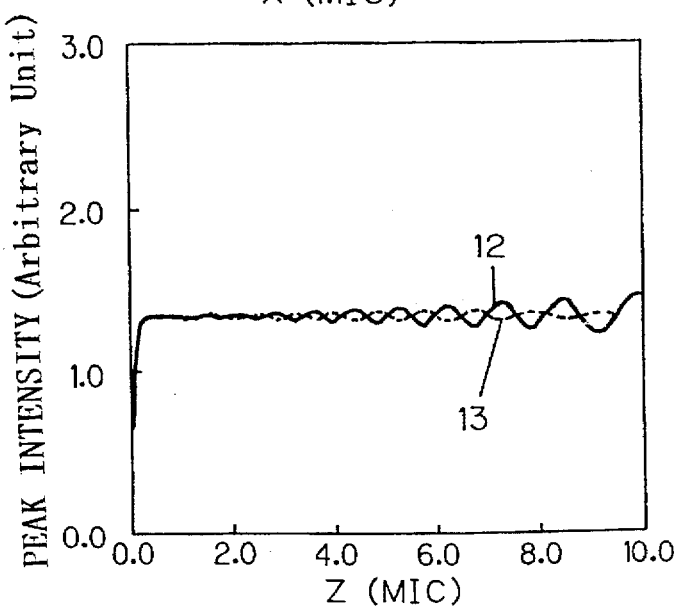
Figure 8:
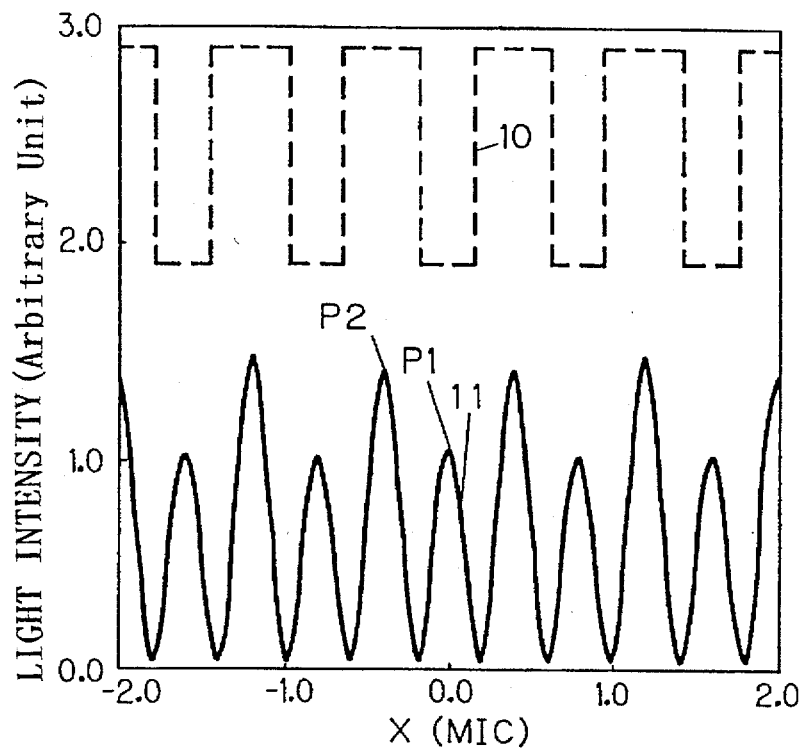
FIG. 8(A) and FIG. 8(B) are second illustrative diagrams showing the characteristics of light intensity distribution on the sensitized film of the exposure equipment according to the first embodiment of the present invention.
Figure 8:
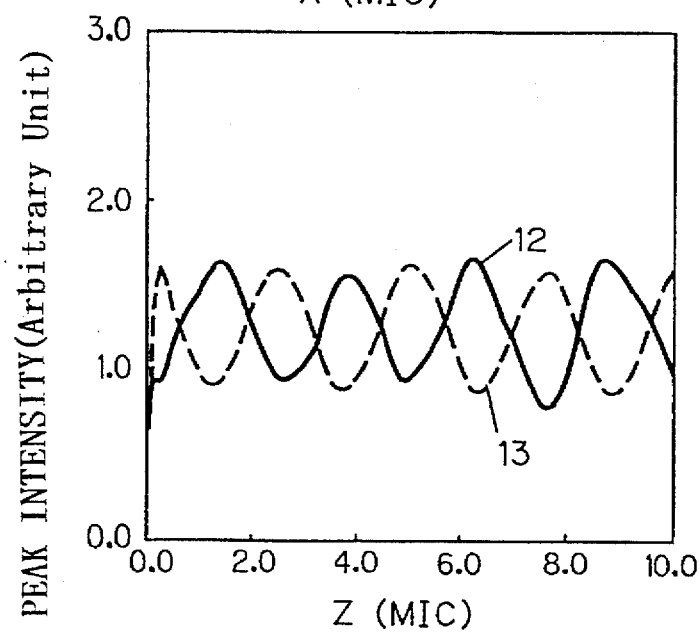
Figure 9:
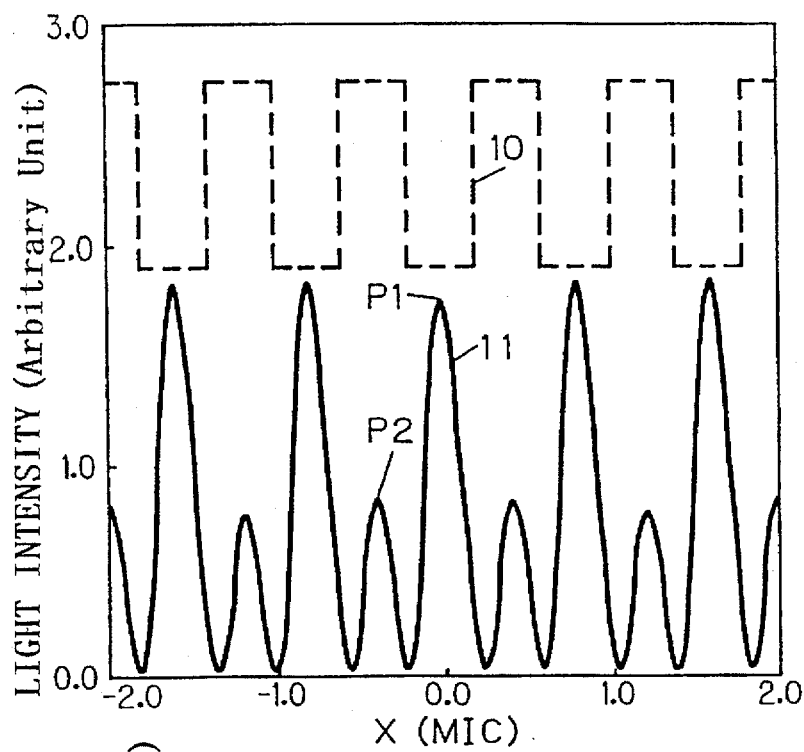
FIG. 9(A) and FIG. 9(B) are third illustrative diagrams showing the characteristics of light intensity distribution on the sensitized film of the exposure equipment according to the first embodiment of the present invention.
Figure 9:
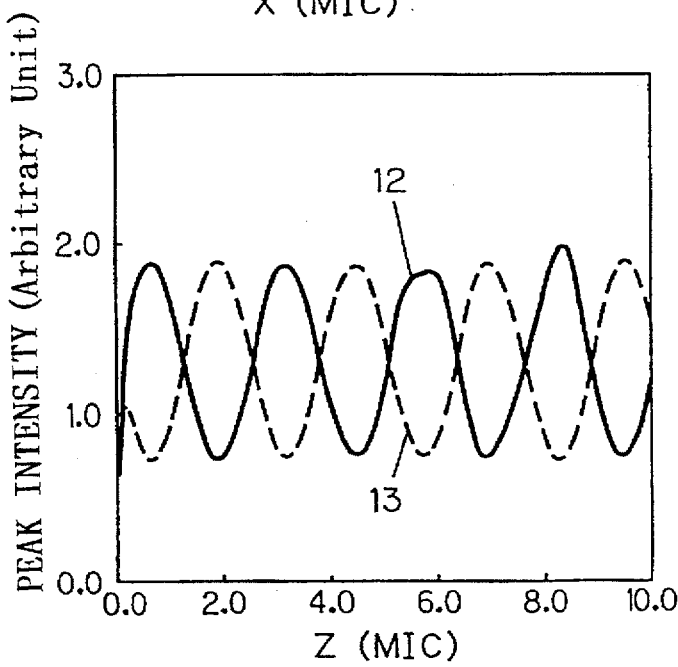
Figure 10:
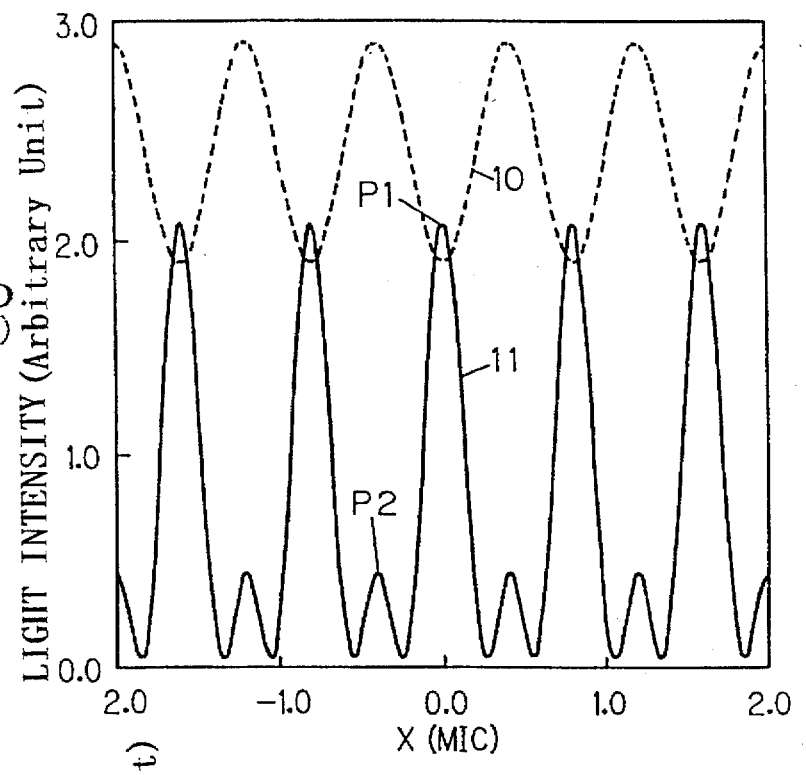
FIG. 10(A) and FIG. 10(B) are fourth illustrative diagrams showing the characteristics of light intensity distribution on the sensitized film of the exposure equipment according to the first embodiment of the present invention.
Figure 10:
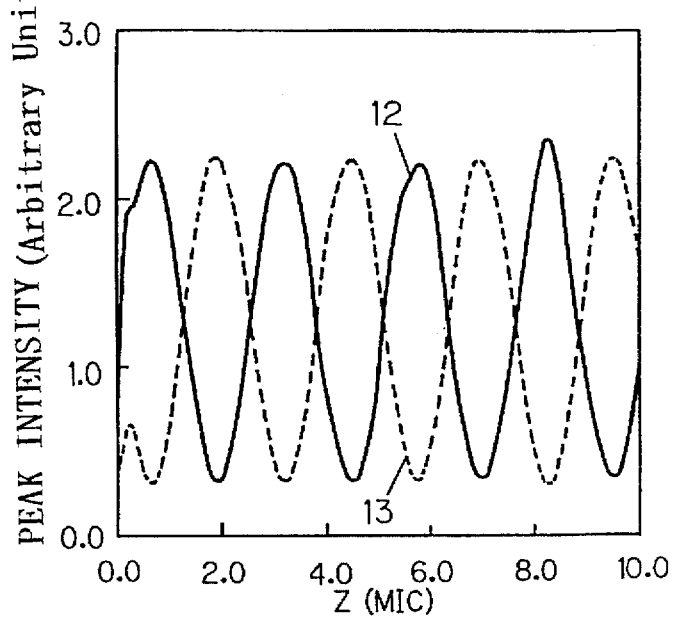

FIG. 6 shows a cross sectional view of the phase shifter of the exposure equipment according to the first embodiment of the present invention.

As shown in FIG. 6, let the pitch of the cyclic rugged structure 6a be $\Lambda$ and the depth h, give the width of the protruded portion with $\epsilon\Lambda$ if the rugged structure is a rectangle, set the origin at the position a distance z from the center of the cyclic construction surface along the normal direction, and consider the coordinate axis in the direction passing the origin O and along the grating vector (vector crossing at right angles in the grating direction).

FIG. 7(A), FIG. 7(B) is the first illustrative diagram showing the characteristics of light intensity distribution on the sensitized film of the exposure equipment according to the first embodiment of this invention, indicating the computation results when analysis is made with $\lambda=0.4579$ μm and the rugged structure assumed to be a rectangle of $\Lambda=0.8$ μm, $h=\lambda/\{2(n-1)\}$, and $\epsilon=0.5$.

FIG. 7(A) shows the light intensity distribution along the x coordinate. In spite of the pitch of the rugged structure 10 being 0.8 μm, a half pitch (0.4 μm pitch) intensity distribution pattern 11 is obtained. The rugged structure 10 schematically shows the cyclic rugged structure 6a shown in FIG. 6 for convenience of description and is drawn with a dotted line to scale of abscissa of FIG. 7(A). For the same effect, in FIG. 8(A)–FIG. 10(A), the rugged structure 10 shown in a dotted line is drawn.

FIG. 7(B) plots the relation of the light intensity P1 at the intensity distribution x=0 μm and light intensity P2 in x=–0.4 μm to the distance z, and a solid line 12 corresponds to the light intensity P1 and a broken line to the light intensity P2. Both have a slight waviness due to influence of boundary diffraction wave generated at the start/end line position (boundary line 601, 602 of the rugged structure 6a shown in FIG. 6) in the x-axis direction of the rugged structure, but generally do not lean to z but provide an equally uniform value.

That is, even if there is an error in the position of the sensitized film 8 (clearance equivalent to the thickness of spacer 7), there is no degradation in the intensity distribution pattern, and contrast of exposure is satisfactory. Consequently, position setting of the exposure substrate is not necessarily carried out by an expensive high-accuracy stepper used for the semiconductor process, and positioning achieved by just inserting the spacer 7 for pressing as described in this embodiment is enough.

FIG. 8(A), FIG. 8(B) is the second illustrative diagram showing the characteristics of the light intensity distribution on the sensitized film of the exposure equipment according to the first embodiment of this invention, indicating the computation results when analysis is made with $\lambda=0.4579$ μm and the rugged structure assumed to be a rectangle of $\Lambda=0.8$ μm, $h=\lambda/\{2(n-1)\}$, and $\epsilon=0.4$.

FIG. 8(A) shows the light intensity distribution along the x coordinate. In spite of the pitch of the rugged structure 10 being 0.8 μm, a half pitch (0.4 μm pitch) intensity distribution pattern 11 is obtained, but since the duty ratio $\epsilon$ of the rugged structure 10 deviates from 0.5, a difference is generated between the light intensity P1 at x=0 μm and the light intensity P2 at x=–0.4 μm.

FIG. 8(B) plots the relation of these light intensities P1 and P2 to the distance z, and a solid line 12 corresponds to the light intensity P1 and a broken line 13 to the light intensity P2. Both have a slight waviness of reverse phase dependent on z, but the intensity ratio is around 1.0:0.6 even under the worst conditions.

FIG. 9(A), FIG. 9(B) is the third illustrative diagram showing the characteristics of the light intensity distribution on the sensitized film of the exposure equipment according to the first embodiment of this invention, indicating the computation results when analysis is made with $\lambda=0.4579$ μm and the rugged structure assumed to be a rectangle of $\Lambda=0.8$ μm, $h=5\lambda/\{6\times 2(n-1)\}$, and $\epsilon=0.5$.

FIG. 9(A) shows the light intensity distribution along the x coordinate. In spite of the pitch of the rugged structure 10 being 0.8 μm, a half pitch (0.4 μm pitch) intensity distribution pattern 11 is obtained, but since the depth of the rugged structure 10 deviates from $\lambda/\{2(n-1)\}$, a difference is generated between the light intensity P1 at x=0 μm and the light intensity P2 at x=–0.4 μm.

FIG. 9(B) plots the relation of these light intensities P1 and P2 to the distance z, and a solid line 12 corresponds to the light intensity P1 and a broken line 13 to the light intensity P2. Both light intensity P1 and P2 have a waviness of reverse phase dependent on z, and the intensity ratio is around 1.0:0.4 even under the worst conditions.

FIG. 10(A), FIG. 10(B) are fourth illustrative diagrams showing the characteristics of light intensity distribution on the sensitized film of the exposure equipment according to the first embodiment of this invention, indicating the computation results of analysis with $\lambda=0.4579$ μm and rugged structure assumed to be a sine wave profile of $\Lambda=0.8$ μm, $h=\lambda/\{2(n-1)\}$.

FIG. 10(A) shows the light intensity distribution along the x coordinate. As in the case of FIG. 7, in spite of the pitch of the rugged structure 10 being 0.8 μm, a half pitch (0.4 μm pitch) intensity distribution pattern 11 is obtained, but since the cross-sectional profile of the rugged structure 10 deviates from the rectangular profile, a large difference is generated between the light intensity P1 at x=0 μm and the light intensity P2 at x=–0.4 μm.

FIG. 10(B) plots the relation of these light intensities P1 and P2 to the distance z, and a solid line 12 corresponds to the light intensity P1 and a broken line 13 to the light intensity P2. Both light intensity P1 and P2 have a large waviness of reverse phase dependent on z, and the intensity ratio is around 1.0:0.15 under the worst conditions.

When allowance for error of the exposure substrate position is considered, as is clear from FIG. 7(A)–FIG. 10(B), in order to optimize the exposure contrast, it is preferable that the cross-sectional profile of the rugged structure should be a rectangle of $h=\lambda/\{2(n-1)\}$, $\epsilon=0.5$, and the allowable range of each parameter for determining the cross-sectional profile should be $0.3\leq\epsilon\leq 0.7$, $0.8\leq 2(n-1)h/\lambda\leq 1.2$. That is, the depth h of the recessed portion may be $k\times\lambda/\{2(n-1)\}$ (where $0.8\leq k\leq 1.2$).

Figure 11:
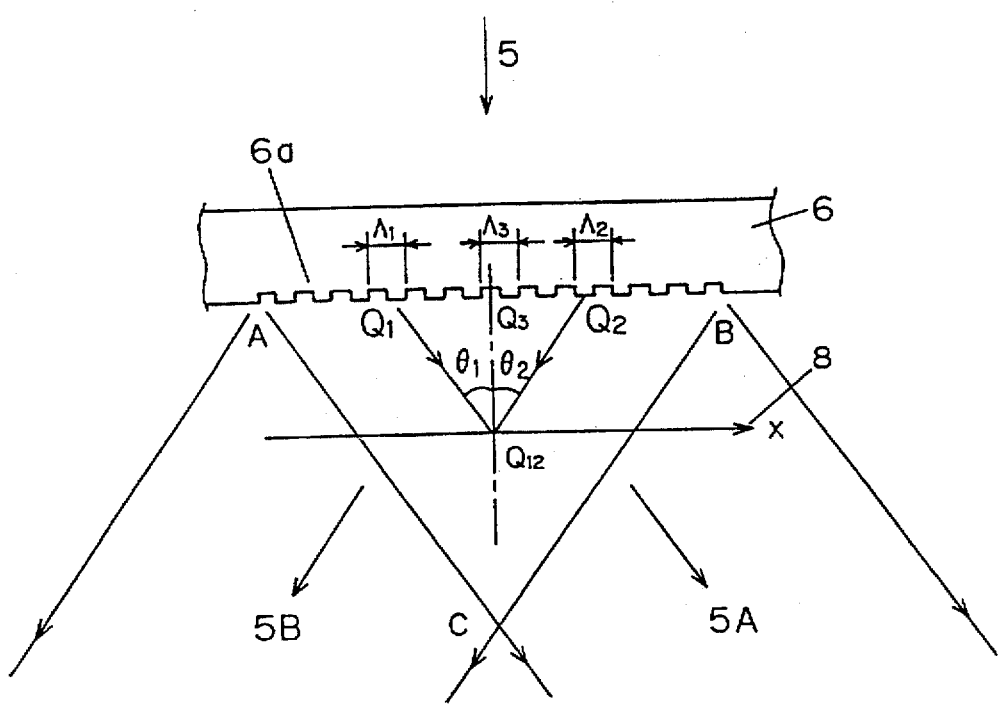
FIG. 11 is a diagram illustrating the principle showing the relationship between the cycle of the cyclic condition and the cycle of the exposure pattern of the exposure equipment according to the embodiment of the present invention.

Now, FIG. 11 is an illustrative drawing that describes the principle showing the relationship between the pitch of the recessed portion or protruded portion on the phase shifter 6 and the pitch of the exposure pattern in the exposure equipment according to the first embodiment of this invention. That is, referring to the drawing, the relationship between the pitch of the recessed portion or protruded portion and the pitch of the exposure pattern will be described in detail.

The light 5 of wavelength $\lambda$ which vertically impinges on the cyclic structure surface 6a of the phase shifter is diffracted after penetrating the cyclic structure, and ± first-order diffracted light 5A, 5B are generated. Let the pitch of the cyclic structure at the position $Q_1$ on the cyclic structure surface 6a denote $\Lambda_1$, and the pitch of the cyclic structure at the position of point $Q_2$ (x=$x_2$) denote $\Lambda_2$ ($\Lambda_1$ and $\Lambda_2$ represent the pitch of the recessed or protruded portion on the phase shifter 6), then, the diffraction angle of the diffracted light at points $Q_1$ and $Q_2$ are given by the following equation:

$$\sin \theta_1 = \lambda/\Lambda_1 \quad (4)$$

$$\sin \theta_2 = \lambda/\Lambda_2 \quad (5)$$

If the diffracted light of + first order diffracted at point $Q_1$ and the diffracted light of − first order diffracted at point $Q_2$ intersect at point $Q_{12}$ on the exposure surface 8, based on the principle of two beam interference, fringes are formed on the point $Q_{12}$. The position of the point $Q_{12}$ (x=$x_3$) is given by the following equation.

$$x_3 = x_1 + (x_2 - x_1) \tan \theta_1 / (\tan \theta_1 + \tan \theta_2) \quad (6)$$

And the pitch $\Lambda_{12}$ of fringes at point $Q_{12}$ is given by the following equation from Eq. (4) and Eq. (5):

$$\Lambda_{12} = \lambda/(\sin \theta_1 + \sin \theta_2) = \Lambda_1 \Lambda_2/(\Lambda_1 + \Lambda_2) \quad (7)$$

Consequently, in the case of uniform pitch, for ($\Lambda_1=\Lambda_2$), $\Lambda_{12}=\Lambda_1/2$, indicating that the intensity distribution pattern of a half pitch of cyclic structure 6a is obtained. Because as long as $\Lambda_1 \leq \lambda$ and $\Lambda_2 \leq \lambda$, diffracted light is generated, it is possible to achieve $\Lambda_{12} \geq \lambda/2$ for the minimum pitch of the intensity distribution pattern (limit of resolution). That is, resolution more than double that of the exposure equipment in the conventional example can be obtained.

When the pitch varies to positions ($\Lambda_2=\Lambda_1 (1+\Delta)$), let the point corresponding to point $Q_{12}$ on the cyclic structure surface be $Q_3$ and the pitch of the cyclic structure at this point (x=$x_3$) be $\Lambda_3$, then, $\Lambda_3$ can be approximated to the following equation if the change of the pitch is continuous with respect to x:

$$\Lambda_3 = (\Lambda_1 \tan \theta_2 + \Lambda_2 \tan \theta_1)/(\tan \theta_1 + \tan \theta_2) \quad (8)$$

Consequently, if $\Delta \ll 1$ (the relation of $\Delta \ll 1$ sufficiently holds for if the exposure position approximates to the cyclic structure surface), the following equation holds for from $\tan \theta_2 = \tan \theta_1 (1 - \Delta/\cos^2 \theta_1)$.

$$\Lambda_3 = \Lambda_1 (1 + \Delta/2) \quad (9)$$

On the other hand, if $\Delta \ll 1$, from Eq. (7), the pitch $\Lambda_{12}$ of fringes can be approximated to the following equation:

$$\Lambda_{12} = \Lambda_1 (1 + \Delta/2)/2 \quad (10)$$

Consequently, the pitch $\Lambda_{12}$ of fringes corresponds to one half the pitch $\Lambda_3$ of the cyclic structure at the position on the cyclic structure surface corresponding to it, and even when the pitch varies to positions, the relationship of one-half pitch is accurately observed. In this way, in the exposure equipment according to the conventional example, a high-accuracy image forming lens is required for projecting the exposure pattern on the reticle onto the exposure surface free from any distortion, but in the present embodiment, only approximating the exposure position to the cyclic structure surface (that is, the structure surface on which the recessed portion and the protruded portion are repeatedly formed by a specified pitch on a flat plate) enables one-half pitch patterning free from distortion.

If it is only in the area where two beams intersect each other that fringes are formed on the exposure surface 8 and if the intersection of the diffracted lights generated from the start point A and the end point B of the cyclic structure is denoted as C, exposure is limited to the area which is surrounded by a triangle ABC and is approximated to the cyclic structure.

Because interference at point $Q_{12}$ takes place among a plurality of beams if the light penetrating the cyclic structure surface 6a contains zero-order light (component which penetrates without diffraction) and light of other orders, contrast of fringes degrade and the contrast also relates to the position of the exposure surface. It is because no diffracted light other than ± first order is generated that fringes with good contrast were obtained in the example of FIG. 7, as described below. In general, if the intensity of nth-order diffracted light generated by penetrating the phase shifter with a rectangular cross section shown in FIG. 6 be $I_n$, the intensity ratio of each diffracted light can be given by the following equation.

$$I_0/I_1 = \pi^2 \{1 - 2\epsilon(1-\epsilon)(1-\cos \delta)\}/\{2(1-\cos \delta) \sin^2 \pi \epsilon\} \quad (11)$$

$$I_2/I_1 = \cos^2 \pi \epsilon \quad (12)$$

except that $\delta$ follows the following equation:

$$\delta = 2\pi(n-1)h/\lambda \quad (13)$$

Under the conditions of FIG. 7(A) and FIG. 7(B) (h=$\lambda/\{2(n-1)\}$, $\epsilon=0.5$, $\lambda<\Lambda<2\lambda$, and no second-order light exists, and from Eq. (11), for zero-order light as well, $I_0=0$. Even if $2\lambda>\Lambda$, from Eq. (12), for second-order light as well, $I_2=0$.

On the other hand, under the conditions of FIG. 8(A) and FIG. 8(B) (h=$\lambda/\{2(n-1)\}$, $\epsilon=0.4$, $\lambda<\Lambda<2\lambda$, and no second-order light exists, but $I_0/I_1=0.11$ and zero-order light is generated (if $2\lambda<\Lambda$, second-order light is also generated from Eq. (12)).

As described above, in order to obtain fringes with good contrast irrespective of the exposed surface position, the small ratio of the zero-order light quantity to the total diffracted light quantity (for example, $I_0/(I_0+2I_1) \leq 0.1$) is essential.

Now, the second embodiment according to this invention will be described in detail.

Because the second embodiment is exactly same as the first embodiment with only exception that the cyclic width of the cyclic structure, that is the pitch $\Lambda$ of the recessed or protruded portion is limited to $\lambda<\Lambda<2\lambda$, the same drawings used as in the case of the first embodiment are referred and overlapping description will be omitted.

Figure 12:
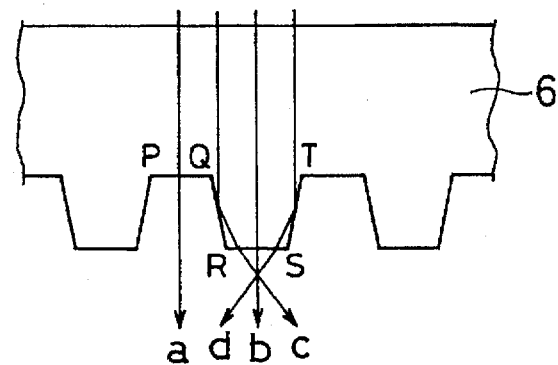
FIG. 12 is a diagram showing the optical path of the light penetrating the cyclic recessed and protruded constructions of a trapezoidal cross section according to the second embodiment of this invention.

In the first embodiment, the cross section of the periodic rugged structure was a rectangle, but in actuality, at the rugged boundary, sagging occurs, and the cross section becomes, for example, a trapezoidal cross section as shown in FIG. 12. In FIG. 12, the light a, b impinging on the bottom surface PQ of the recessed portion and the top surface RS of the protruded portion of the phase shifter penetrates the interface as it is but the light c, d impinging on the slopes QR, ST totally reflects this surface and penetrates the top surface RS of the recessed portion and the interface of opposite slopes ST, QR.

Consequently, since light c, d is superimposed on light a, b, not only the phase modulation of the penetrating light but also amplitude modulation are disturbed. Eq. (11) and Eq. (12) are results obtained with the shifter designated to the phase grating and phase modulation only taken into account, and these relational expressions do not hold for if the phase modulation is disturbed and amplitude modulation is added to this. Table 1 shows experimental results in which each diffracted light intensity penetrating the shifter which is trially made for desired specifications of $\Lambda=1.0$ μm, $n=1.5$, $h=\lambda/\{2(n-1)\}$, and $\lambda=0.4579$ μm.

The experiment, the results of which are shown in Table 1, is a comparison experiment for comparing experimental results shown in Table 2 discussed later.

TABLE 1

Experimental results in which each intensity of diffracted light penetrating the phase shifter is evaluated:

| Order of diffraction | Light intensity |
| --- | --- |
| - second order | $L_{-2}$ = 310 mW |
| - first order | $L_{-1}$ = 800 mW |
| zero order | $I_0$ = 80 mW |
| first order | $I_1$ = 800 mW |
| second order | $I_2$ = 330 mW |

Because $I_0/I_1$ (=0.1), $\delta=\pi$ and $\epsilon=0.5$ hold for approximately and, then, $I_2/I_1=1$, but actual $I_2/I_1$ (=0.4) is abnormally large, and it is difficult for Eq. (11) and Eq. (12) to simultaneously hold for. This contradiction is attributed to the existence of effects of disturbance in the phase modulation and amplitude modulation by total reflection as shown in FIG. 12.

Consequently, because strong second-order light exists even though zero-order light is eliminated, for the interference pattern, equimultiplication of the shifter cycle is dominant due to interference between first order and second order, and it is unable to achieve half pitch.

However, the second embodiment is characterized by limiting the cyclic width to $\lambda<\Lambda<2\lambda$. In this event, diffracted light up to first order is generated and diffracted light of second order and higher does not exist theoretically.

If as shown in FIG. 12, the penetrating light distribution is disturbed by the existence of the slope, the second order diffracted light does not exist. Because conditions to extinguish zero-order light always exist in the vicinity of Eq. (11), generation of diffracted light other than ± first order diffracted light can be nearly completely suppressed.

Table 2 shows experimental results in which each diffracted light intensity penetrating the shifter which is trially made for desired specifications of $\Lambda=1.0$ μm, n 1.5, $h=\lambda/\{2(n-1)\}$, and $\lambda=0.5145$ μm.

TABLE 2

Experimental results in which each intensity of diffracted light penetrating the phase shifter is evaluated:

| Order of diffraction | Light intensity |
| --- | --- |
| - second order | $L_{-2}$ = 0 mW (not exist.) |
| - first order | $L_{-1}$ = 780 mW |
| zero order | $I_0$ = 40 mW |
| first order | $I_1$ = 790 mW |
| second order | $I_2$ = 0 mW (not exist.) |

In this experiment, generation of diffracted light other than ± first order can be nearly completely suppressed as theoretically specified, and half-pitch intensity distribution pattern was able to be determined by microscopic observation.

Now, the third embodiment is described.

The third embodiment is the exactly same as the first embodiment except that the configuration of the phase shifter differs, and the same drawings used in the description of the first embodiment are referred and overlapping description will be omitted.

Figure 13:
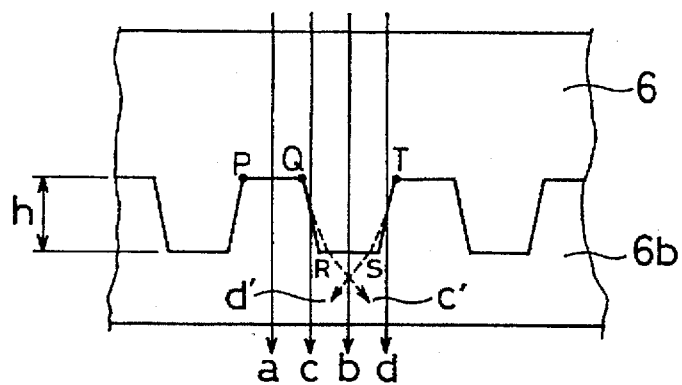
FIG. 13 is a diagram showing the optical path of the light penetrating the cyclic recessed and protruded constructions of a trapezoidal cross section according to the third embodiment of this invention.

FIG. 13 shows a cross-sectional view of the phase shifter of the exposure equipment according to the third embodiment of this invention. In FIG. 13, the phase shifter surface is covered with a transparent layer 6b with refraction index $n_0$ ($n_0>n$, where n is a refraction index of the shifter 6), and the refraction index n0 satisfies the following relational expression with the height of recess and protrusion denoted to h:

$$h=\lambda/\{2(n_0-n)\} \quad (14)$$

The light a, b impinging on the bottom surface PQ of the recessed portion and the top surface RS of the protruded portion of the phase shifter 6 penetrates the interface with the transparent layer 6b as it is. The light c, d impinging on the slope QR, ST has no total reflection at the slope based on the relation $n_0>n$ and refracts and reflects the interface as it is, and part is reflected as c', d'. Light c', d' penetrates the interface of slope ST, QR and is superimposed over the light a or b, but because the light quantity is small, the degree of influence is small. Consequently, disturbance of phase modulation and amplitude modulation can be suppressed by the existence of the transparent layer 6b, and even in the case of $2\lambda<\Lambda$, relational expressions shown with Eq. (11) and Eq. (12) hold for, and generation of diffracted light other than ± first order can be suppressed.

Table 3 shows experimental results in which ZnS ($n_0=2.0$) film is formed on the sample shown in Table 1 (film thickness: 2 μm), and slight irregularities remaining on the surface are smoothed out by filling UV resin by the 2P process, and evaluation is made (measuring wavelength $\lambda=0.488$ μm).

TABLE 3

Experimental results in which each intensity of diffracted light penetrating the phase shifter is evaluated:

| Order of diffraction | Light intensity |
| --- | --- |
| - second order | $L_{-2}$ = 200 mW |
| - first order | $L_{-1}$ = 3700 mW |
| zero order | $I_0$ = 300 mW |
| first order | $I_1$ = 4200 mW |
| second order | $I_2$ = 200 mW |

In this experiment, the intensity of other diffracted lights are suppressed to a sufficiently small level as compared to the intensity of ± first order diffracted light, and half-pitch intensity distribution pattern was able to be determined by microscopic observation. The depth h of the recessed portion is not necessarily $\lambda/\{2(n_0-n)\}$, but it may only be able to suppress generation of diffracted light other than ± first order.

Now, description will be made on one embodiment of this invention stated in claim 7.

This embodiment does not improve the resolution of the conventional exposure equipment, but is designed to form patterns using fringes formed on the exposed surface.

Figure 14:
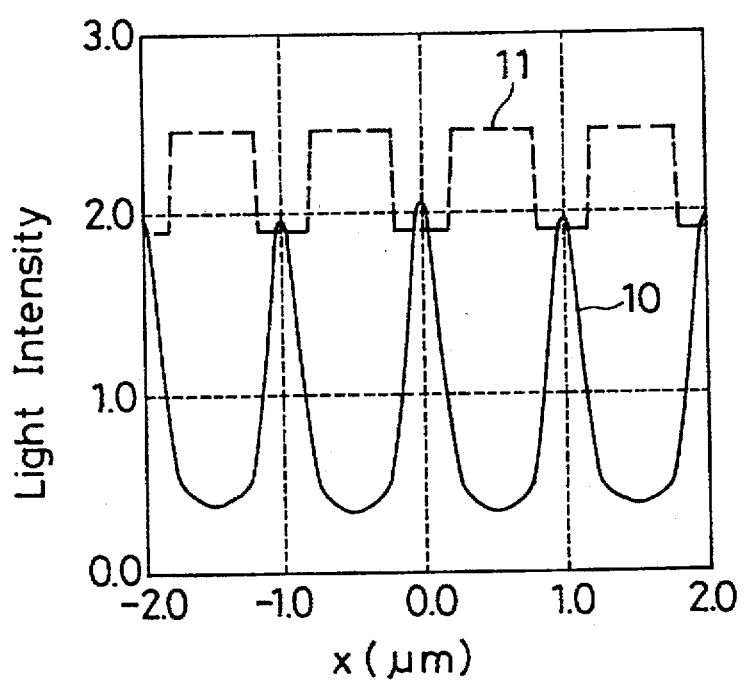
FIG. 14 is a diagram showing the distribution of light intensity on the sensitized film of the exposure equipment according to an embodiment of this invention.

The embodiment is the exactly same as the first embodiment except that the specifications of cross section of the phase shifter differ, and the same drawings used in the description of the first embodiment are referred and overlapping description will be omitted. Specifications of the phase shifter cross section in this embodiment greatly deviate from the specifications of the first embodiment ($\epsilon=0.5$, $h=\lambda/\{2(n-1)\}$). For example, let $\epsilon=0.4$ and $\delta=100$ degrees, from Eq. (11) and Eq. (12), $I_0/I_1=2.03$, $I_2/I_1=0.095$, that is, the sum of the ± first order diffracted light intensity ($I_1+I_{-1}$) becomes nearly equal to the sum of the zero order and ± second order diffracted light intensity ($I_0+I_2+I_{-2}$). The curve 10 of FIG. 14 shows the light intensity distribution on the sensitized film 10λ away under the conditions of $\epsilon=0.4$ and $\delta=100$ degrees, and is the computation results with $\lambda=0.4579$ μm and the rugged structure analyzed as a rectangle of $\Lambda=1.0$ μm (shown with a broken line 11). Because of interference of ± first order and zero order as well as ± first order and ± second order diffracted light, the intensity distribution pattern with a pitch (1.0 μm pitch) equivalent to that of the shifter is obtained.

Conditions of the cross section specifications of the cyclic structure in this embodiment are lenient, in which only bringing the sum of the intensity of first order diffracted light (or odd order diffracted light) and the sum of the intensity of other diffracted light (or even order diffracted light) to the same level (for example, one half to double) can easily form fringes of the pitch equivalent to that of the shifter. That is, in this embodiment, it is unable to form half-pitch fringes of the shifter, but there are no complicated imitations or complicated problems such as removal of second order diffracted light, and fabrication of the shifter becomes easy.

In the above-mentioned first, second, and third embodiments, as well as the last embodiment, the patterns of the rugged structure are described as a form of stripe (form along a straight line), but they may be cyclic patterns along the curve such as circle (that is, patterns formed by repetition), and the pitch of the recessed portion or protruded portion may vary in accord with positions, and the effects in that half-pitch (or equi-pitch) fine pattern exposure of the rugged structure is possible can be achieved in the same way.

The cyclic rugged structure can be formed by a process for forming a transparent film with refraction index n on a parallel flat plate, and after patterning, this film is etched, in addition to a process for etching a parallel flat plate, or by a process for fabricating a master and transferring the profile by UV resin.

The light impinging on the phase shifter is not necessarily vertically impinged but the same effects can be obtained by tilted impingement. In addition, the phase shifter is not necessarily a parallel flat plate, but it may only be a plane whose outgoing beam side is equipped with a cyclic structure. And examples are explained with laser used for the exposure light source, but the light source emitting partly coherent light may also be used.

The plate member of this invention is a reticle equipped with a phase shifter in each embodiment of this invention, but the invention shall not be limited to this but for example, it may be a reticle not equipped with a phase shifter.

As described above, according to this invention, it is possible to easily provide an exposure equipment with high resolution whose resolution limit can be extended to λ/2 in terms of pitch without using a complicated optical system. Because even complicated exposure patterns in which the pitch depends on the position can be transferred to the exposed surface without any distortion, a high-accuracy optical system is not necessarily used, and even when there is some error in the location of the exposure substrate, it has another effect in that no expensive stepper (transport system of the exposure substrate) is not needed because the exposure contrast is able to be maintained.

What is claimed is:

1. An exposure equipment comprising a laser beam source, an expanding means for expanding laser beams of wavelength λ outgoing from the laser beam source and forming it into plane wave of parallel beams, a plate-form member formed with transparent material with refraction index n, and an exposure substrate located close to the plate-form member on the surface of which sensitized film is formed, wherein on the surface of the plate-form member facing against the exposure substrate side, recessed portion and protruded portion are repeatedly formed, and allowing the plane wave expanded by the expanding means to penetrate the recessed portion or protruded portion generates a ± first order diffracted light, and the sensitized film is located at the position in which the + first order diffracted light and the − first order diffracted light intersect each other, fringes generated by interference between the diffracted lights exposes the sensitized film.

2. An exposure equipment according to claim 1, wherein ratio of light quantity of the zero order light penetrating as it is without diffraction to light quantity of all the lights penetrating the recessed portion or protruded portion is 0.1 or less.

3. An exposure equipment according to claim 1 wherein the depth of the recessed portion is $k\times\lambda/\{2(n-1)\}$ (where $0.8\leq k\leq 1.2$), and the cross section of the recessed portion or the protruded portion is substantially rectangle, and the ratio of a with of the protruded portion to a pitch of the protruded portion ranges from 0.3 to 0.7.

4. An exposure equipment according to claim 1 wherein a pitch of the recessed portion or the protruded portion is set between λ and 2λ.

5. An exposure equipment according to claim 1 wherein the recessed portion or protruded portion is covered with a transparent layer of refraction index $n_0$ (where, $n_0>n$) and the film thickness of the transparent layer is greater than a pitch of the recessed portion or protruded portion.

6. An exposure equipment according to claim 5 wherein the depth of the recessed portion is $k\times\lambda/\{2(n_0-n)\}$ (where $0.8\leq k\leq 1.2$), and the cross section of the recessed portion or protruded portion is substantially rectangle, and the ratio of a width of the protruded portion to a pitch of the protruded portion ranges from 0.3 to 0.7.

7. An exposure equipment stated in claim 1, wherein the recessed portion and/or protruded portion formed on the surface of the plate-form member is formed in a straight line, circle, or curve.

8. An exposure equipment stated in claim 2, wherein the recessed portion and/or protruded portion formed on the surface of the plate-form member is formed in a straight line, circle, or curve.

9. An exposure equipment stated in claim 3, wherein the recessed portion and/or protruded portion formed on the surface of the plate-form member is formed in a straight line, circle, or curve.

10. An exposure equipment stated in claim 4, wherein the recessed portion and/or protruded portion formed on the surface of the plate-form member is formed in a straight line, circle, or curve.

11. An exposure equipment stated in claim 5, wherein the recessed portion and/or protruded portion formed on the surface of the plate-form member is formed in a straight line, circle, or curve.

12. An exposure equipment stated in claim 6, wherein the recessed portion and/or protruded portion formed on the surface of the plate-form member is formed in a straight line, circle, or curve.

13. An exposure equipment stated in claim 1, wherein pitch of the recessed portion nor the protruded portion varies in accord with positions on the surface.

14. An exposure equipment stated in claim 2, wherein pitch of the recessed portion nor the protruded portion varies in accord with positions on the surface.

15. An exposure equipment stated in claim 3, wherein pitch of the recessed portion nor the protruded portion varies in accord with positions on the surface.

16. An exposure equipment stated in claim 4, wherein pitch of the recessed portion nor the protruded portion varies in accord with positions on the surface.

17. An exposure equipment stated in claim 5, wherein pitch of the recessed portion nor the protruded portion varies in accord with positions on the surface.

18. An exposure equipment stated in claim 6, wherein pitch of the recessed portion nor the protruded portion varies in accord with positions on the surface.

19. An exposure equipment comprising a laser beam source, an expanding means for expanding laser beams of wavelength $\lambda$ outgoing from the laser beam source and forming it into plane wave of parallel beams, a plate-form member formed with transparent material with refraction index n, and an exposure substrate located close to the plate-form member on the surface of which sensitized film is formed, wherein on the surface of the plate-form member facing against the exposure substrate side, recessed portion and protruded portion are repeatedly formed, and allowing the plane wave expanded by the expanding means to penetrate the recessed portion or protruded portion generates a zero order and $\pm$ first order to $\pm q$ order ($q \geq 1$) diffracted lights, and ratio of sum of light quantity of even order diffracted lights of these lights to sum of light quantity of odd order diffracted lights of these lights ranges from 0.5 to 2.0, the sensitized film is located at the position in which these diffracted lights intersect one another, fringes generated by interference between the diffracted lights exposes the sensitized film.

20. An exposure equipment stated in claim 19, wherein the recessed portion and/or protruded portion formed on the surface of the plate-form member is formed in a straight line, circle, or curve.

21. An exposure equipment stated in claim 19, wherein pitch of the recessed portion nor the protruded portion varies in accord with positions on the surface.

* * * * *